United States Patent
Kathail et al.

(10) Patent No.: US 9,652,570 B1
(45) Date of Patent: May 16, 2017

(54) AUTOMATIC IMPLEMENTATION OF A CUSTOMIZED SYSTEM-ON-CHIP

(71) Applicant: Xilinx, Inc., San Jose, CA (US)

(72) Inventors: Vinod K. Kathail, Palo Alto, CA (US); L. James Hwang, Portola Valley, CA (US); Sundararajarao Mohan, Sunnyvale, CA (US); Jorge E. Carrillo, San Jose, CA (US); Hua Sun, San Jose, CA (US); Tom Shui, Mountain View, CA (US); Yogesh L. Chobe, Santa Clara, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 14/845,100

(22) Filed: Sep. 3, 2015

(51) Int. Cl.
   *G06F 17/50* (2006.01)
(52) U.S. Cl.
   CPC ........ *G06F 17/5045* (2013.01); *G06F 17/505* (2013.01)
(58) Field of Classification Search
   CPC ............. G06F 17/5045; G06F 17/5054; G06F 17/5031; G06F 11/3624; G06F 13/00; G06F 13/10; G06F 15/177; G06F 15/7867; G06F 17/5022; G06F 17/5027; G06F 17/505; G06F 2217/86; G06F 8/41; G06F 8/447
   See application file for complete search history.

(56) References Cited

U.S. PATENT DOCUMENTS

| | | | | |
|---|---|---|---|---|
| 6,584,601 B1* | 6/2003 | Kodosky | .............. | G06F 17/5054 715/771 |
| 7,222,314 B1* | 5/2007 | Miller | ................. | G06F 17/5045 716/103 |
| 7,346,881 B2* | 3/2008 | Wang | .................. | G06F 9/30014 712/E9.017 |
| 7,437,701 B1* | 10/2008 | Dutra | .................. | G06F 17/5022 716/104 |
| 7,539,967 B1* | 5/2009 | Orthner | ............... | G06F 15/7867 326/38 |
| 8,079,013 B1* | 12/2011 | Ma | ....................... | G06F 17/5045 703/13 |
| 8,185,850 B1* | 5/2012 | Schumacher | ......... | G06F 17/504 716/103 |

(Continued)

OTHER PUBLICATIONS

"SDSoC User Guide: Platforms and Libraries," XILINLX, INC., User Guide, UG1146, Feb. 4, 2015, 36 pg., San Jose, CA USA.

(Continued)

*Primary Examiner* — Nha Nguyen
(74) *Attorney, Agent, or Firm* — Kevin T. Cuenot (57) ABSTRACT

Implementing a system-on-chip (SOC) design specified as a high level programming language (HLL) application may include querying, using a computer, a platform description to determine an available interface of a platform for a target integrated circuit and generating, using the computer, hardware for a function of the HLL application marked for hardware acceleration and hardware coupling the marked function with the available interface of the platform. Implementing the SOC design may also include modifying, using the computer, the HLL application with program code configured to access the generated hardware for the marked function and building, using the computer, the hardware and the software of the SOC design.

20 Claims, 4 Drawing Sheets

(56) References Cited

U.S. PATENT DOCUMENTS

| | | | |
|---|---|---|---|
| 8,572,534 B2* | 10/2013 | Czeck | G06F 17/5031 716/106 |
| 8,650,517 B1* | 2/2014 | Sundararajan | G06F 17/5045 716/101 |
| 8,762,916 B1 | 6/2014 | Kathail et al. | |
| 8,775,986 B1* | 7/2014 | Mohan | G06F 17/5054 716/104 |
| 9,075,624 B2 | 7/2015 | Carrillo | |
| 9,147,024 B1* | 9/2015 | Kathail | G06F 17/505 |
| 9,223,921 B1* | 12/2015 | Carrillo | G06F 17/5054 |
| 2003/0135834 A1* | 7/2003 | Tojima | G06F 17/5045 716/113 |
| 2007/0288874 A1* | 12/2007 | Czeck | G06F 17/5031 716/102 |
| 2012/0200315 A1* | 8/2012 | Dimond | G06F 17/5054 326/39 |
| 2014/0380287 A1* | 12/2014 | Carrillo | G06F 8/41 717/140 |
| 2015/0109024 A1* | 4/2015 | Abdelfattah | H03K 19/017581 326/41 |

OTHER PUBLICATIONS

U.S. Appl. No. 14/540,854, Carrillo, Jorge E., et al., filed Nov. 13, 2014, San Jose, CA USA.

U.S. Appl. No. 14/535,258, Kathail, Vinod K., et al., filed Nov. 6, 2014, San Jose, CA USA.

* cited by examiner

AUTOMATIC IMPLEMENTATION OF A CUSTOMIZED SYSTEM-ON-CHIP

FIELD OF THE INVENTION

This disclosure relates to integrated circuits (ICs) and, more particularly, to the automatic implementation of a customized system-on-chip.

BACKGROUND

A system-on-chip (SOC) is a type of integrated circuit (IC) that includes a processor and one or more other circuits. The SOC may be built using a single chip substrate. The processor executes program code and is coupled to the circuits so that the processor and the circuits operate cooperatively with one another. One example of an SOC is a chip level implementation of a computer or other data processing system. In some SOCs, the processor is coupled to programmable circuitry that may be used to implement various circuits.

Creating a custom SOC requires expertise in both software development and hardware design. Traditionally, software development and hardware design have been separate fields of endeavor with each requiring specialized training and knowledge. In the case of an SOC that includes programmable circuitry, specialized knowledge of the particular architecture of the target IC has also been required. In consequence, the creation of a customized SOC has been a complex and time consuming undertaking requiring skilled software developers and skilled hardware designers working collaboratively.

SUMMARY

A method of implementing a system-on-chip (SOC) design specified as a high level programming language (HLL) application may include querying, using a computer, a platform description to determine an available interface of a platform for a target integrated circuit (IC) and generating, using the computer, hardware for a function of the HLL application marked for hardware acceleration and hardware coupling the marked function with the available interface of the platform. The method may also include modifying, using the computer, the HLL application with program code configured to access the generated hardware for the marked function and building, using the computer, the hardware and the software of the SOC design.

A system may include a processor programmed to initiate executable operations. The executable operations may include querying a platform description to determine an available interface of a platform for a target IC and generating hardware for a function of the HLL application marked for hardware acceleration and hardware coupling the marked function with the available interface of the platform. The executable operations may also include modifying the HLL application with program code configured to access the generated hardware for the marked function and building the hardware and the software of the SOC design.

A non-transitory computer-readable storage medium has instructions stored thereon which, when executed by a processor, perform a method. The method may include querying a platform description to determine an available interface of a platform for a target IC and generating hardware for a function of the HLL application marked for hardware acceleration and hardware coupling the marked function with the available interface of the platform. The method may also include modifying the HLL application with program code configured to access the generated hardware for the marked function and building the hardware and the software of the SOC design.

This Summary section is provided merely to introduce certain concepts and not to identify any key or essential features of the claimed subject matter. Other features of the inventive arrangements will be apparent from the accompanying drawings and from the following detailed description.

BRIEF DESCRIPTION OF THE DRAWINGS

The inventive arrangements are illustrated by way of example in the accompanying drawings. The drawings, however, should not be construed to be limiting of the inventive arrangements to only the particular implementations shown. Various aspects and advantages will become apparent upon review of the following detailed description with reference to the drawings.

DETAILED DESCRIPTION OF THE DRAWINGS

While the disclosure concludes with claims defining novel features, it is believed that the various features described within this disclosure will be better understood from a consideration of the description in conjunction with the drawings. The process(es), machine(s), manufacture(s) and any variations thereof described herein are provided for purposes of illustration. Specific structural and functional details described within this disclosure are not to be interpreted as limiting, but merely as a basis for the claims and as a representative basis for teaching one skilled in the art to variously employ the features described in virtually any appropriately detailed structure. Further, the terms and phrases used within this disclosure are not intended to be limiting, but rather to provide an understandable description of the features described.

This disclosure relates to integrated circuits (ICs) and, more particularly, to the automatic implementation of a customized system-on-chip (SOC). In accordance with the inventive arrangements described within this disclosure, an SOC design may be specified in a high level programming language (HLL) application. The HLL application may be automatically implemented within a target IC that has an SOC architecture. Users with little or no experience with hardware design may create and/or develop software in an HLL that may be implemented within the target IC as a combination of software and hardware resulting in a customized SOC.

In one arrangement, the HLL application may include a plurality of functions. One or more of the functions may be marked for hardware acceleration and implemented in hardware within the target IC. The marked functions may be processed through a design flow to implement the marked functions in programmable circuitry of the target IC. The HLL application may undergo further processing such as modification of the source code, compilation, and/or linking. The HLL application may be transformed into, or linked to, a runtime file that may execute in the processor of the target IC and a configuration bitstream that may implement hardware accelerated functions in circuitry of the target IC. The circuitry specified by the configuration bitstream may interoperate with the processor of the target IC to realize the customized SOC.

In another arrangement, the HLL application may be implemented in combination with another existing design for the target IC called a platform. The platform may include hardware such as one or more circuit blocks that may be implemented within the programmable circuitry of the target IC and/or software that may be executed by the processor of the target IC. For example, the platform may provide basic functionality in terms of input and output. The platform may include an operating system executable by the processor of the target IC and one or more circuit blocks that may be implemented in circuitry of the target IC that provide data input and data output functions. In general, the platform provides a baseline design that may be extended or augmented by the user's HLL application.

As such, the HLL application may be implemented in combination with the platform thereby extending the functionality of the platform. For example, the HLL application may specify one or more signal processing functions that may be implemented in hardware and/or software and layered on top of the infrastructure provided by the platform. By effectively allowing the HLL application to be added to the platform, a software developer is free to focus on specialized functions using software development techniques. The user does not need hardware design experience to implement functionality already provided by the platform such as I/O circuitry or to perform other hardware design related tasks.

The inventive arrangements described herein may be implemented as a method or process performed by a computer or other system. In another aspect, the inventive arrangements may be implemented as a system having a processor, where the processor performs the operations described herein. In still another aspect, the inventive arrangements may be implemented as a non-transitory computer-readable storage medium storing program code that, when executed, causes a system such as a computer to perform and/or initiate a method or process.

For purposes of simplicity and clarity of illustration, elements shown in the figures have not necessarily been drawn to scale. For example, the dimensions of some of the elements may be exaggerated relative to other elements for clarity. Further, where considered appropriate, reference numbers are repeated among the figures to indicate corresponding, analogous, or like features.

Figure 1:
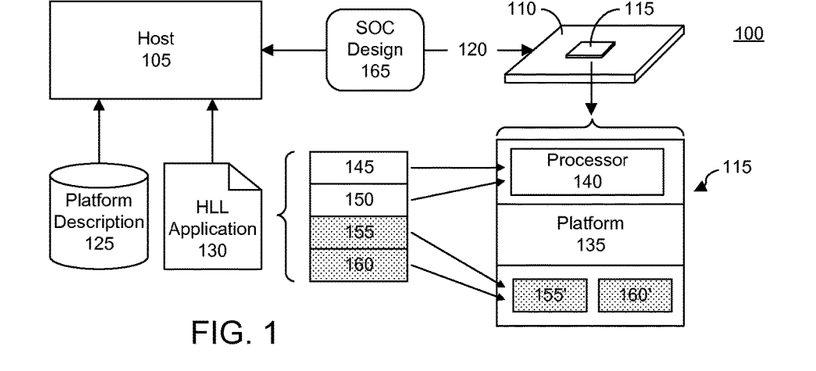
FIG. 1 is a block diagram illustrating an exemplary design environment for implementing a customized system-on-chip (SOC) design.

FIG. 1 is a block diagram illustrating an exemplary development environment 100 for implementing a customized SOC. As pictured, development environment 100 may include a host 105 coupled to a circuit board 110. A target IC 115 may be coupled to circuit board 110. Target IC 115 may be a programmable IC. Further, target IC 115 may be an SOC. Host 105 may be coupled to circuit board 110 through a communication link 120.

Host 105 may be implemented as a data processing system executing a suitable integrated development environment (IDE) or other electronic design automation (EDA) application. Circuit board 110 may be implemented as a printed circuit board or card with circuitry thereon coupling communication link 120 with IC 115. Communication link 120 may be implemented as any of a variety of different wired and/or wireless connections.

In operation, host 105 may receive a platform description 125 and an HLL application 130. Platform description 125 may store a variety of hardware and software components describing a platform 135 that may be implemented in target IC 115. Platform description 125 may be stored in a data structure in a computer-readable storage medium. For example, platform description 125 may be implemented as one or more text files, a database, one or more markup language files, or the like. HLL application 130 may be specified as source code in a high level programming language such as C, C++, or the like. In one aspect, HLL application 130 may be formatted so that HLL application 130 may be compiled into object code and executed in a processor 140 of target IC 115 if compiled to do so.

As pictured, HLL application 130 may include a plurality of functions 145, 150, 155, and 160. For purposes of illustration, the shaded functions of HLL application 130 are marked for hardware acceleration. As such, functions 155 and 160 will be implemented in hardware within target IC 115 as opposed to being executed by processor 140 of IC 115. Functions 145 and 150 may be executed by processor 140.

In one aspect, host 105 may query platform description 125 and determine various attributes of platform 135. Platform description 125 may be implemented within host 105 and/or within another data processing system coupled to host 105. Host 105 may process HLL application 130 to operate in cooperation with platform 135. For example, platform 135 may specify one or more circuits that may be implemented within programmable circuitry of target IC 115 and/or one or more software components that may execute in processor 140. Host 105 may generate hardware accelerators 155' and 160' for functions 155 and 160. Hardware accelerators 155' and 160' may be functionally equivalent circuit implementations of functions 155 and 160, respectively.

Host 105 may provide the resulting SOC design 165 to target IC 115 for implementation therein. In one arrangement, SOC design 165 may be specified as one or more executable files, e.g., binaries, and a configuration bitstream specifying circuitry to be implemented within target IC 115. A user, working through host 105 may also evaluate the performance of SOC design 165 once implemented within target IC 115.

Figure 2:
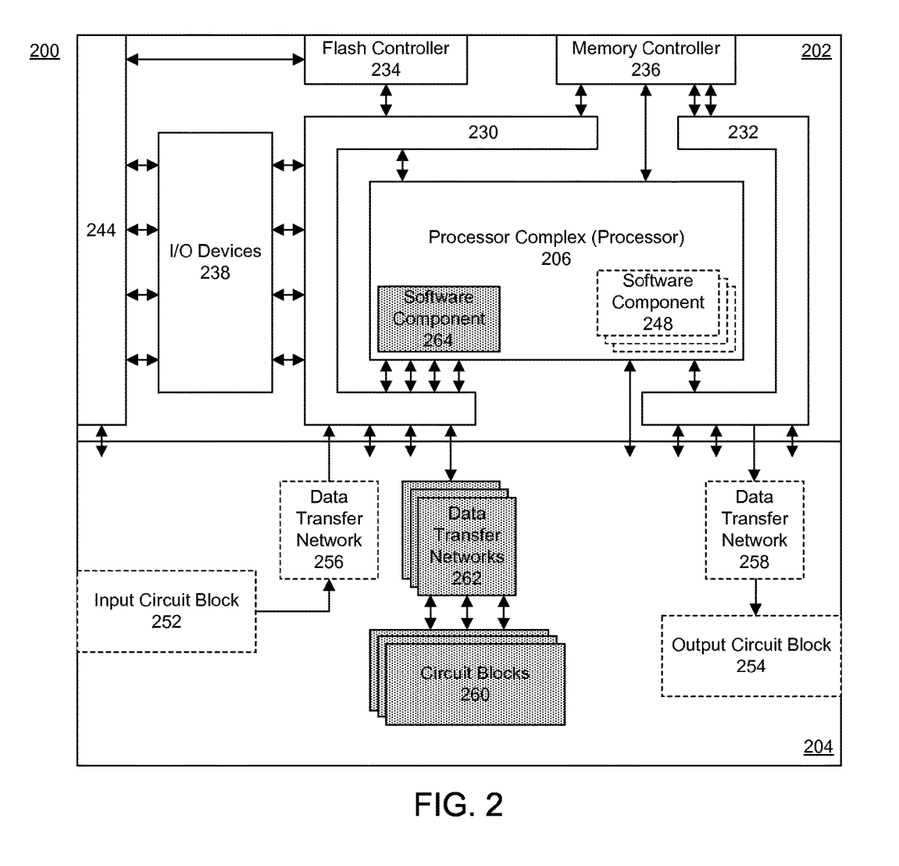
FIG. 2 is a block diagram illustrating an exemplary architecture for an integrated circuit (IC).

FIG. 2 is a block diagram illustrating an exemplary architecture 200 for an IC and an exemplary platform. Architecture 200 is representative of an SOC type of IC. Architecture 200 includes a processor system 202 and programmable circuitry 204. An example of a device that includes a processor system and programmable circuitry may be one or more of the XILINX Zynq® family of SOC type ICs. In one arrangement, architecture 200 may be used to implement target IC 115 of FIG. 1.

Processor system 202 is hardwired. In this regard, the various elements pictured within processor system 202 exist within architecture 200 without first having to load configuration data, i.e., a configuration bitstream. Programmable circuitry 204 is not hardwired. Programmable circuitry 204, as described herein, may include one or more programmable circuit blocks or tiles. The programmable circuit blocks may be configured to form particular circuit structures and/or systems that perform particular operations and/or functions only after configuration data is loaded into configuration memory cells of an IC utilizing architecture 200.

Processor system 202 may include a processor complex 206, also referred to as a processor. Processor 206 may include one or more cores configured to execute program code. Processor 206 may also include one or more other hardwired circuit blocks. For example, processor 206 may include hardwired circuit blocks such as one or more digital signal processing engines, one or more counters, a snoop control unit, on-chip memory, an interrupt controller, a direct memory access (DMA) controller, one or more timers, and a configuration block that may include one or more configuration registers.

Processor 206 may be coupled with other elements within processor system 202 through on-chip interconnects 230 and 232. One example of an interconnect structure that may be used to implement interconnects 230 and/or 232 is the Advanced Microcontroller Bus Architecture (AMBA®) Interconnect available from ARM Limited of Cambridge, United Kingdom. Interconnects 230 and 232 provide on-chip connection and management of functional circuit blocks in an SOC.

Interconnect 230 may couple processor 206 to a flash controller 234, a memory controller 236 supporting any of a variety of available external RAM devices, and one or more I/O devices 238. Interconnect 230 further may provide communication links into programmable circuitry 204 that couple various circuits and/or systems that may be implemented within programmable circuitry 204 to processor 206, flash controller 234, memory controller 236, and/or I/O devices 238. Interconnect 232 couples processor 206 to memory controller 236. Interconnect 232 may also provide communication links into programmable circuitry to couple circuits implemented therein to processor 206 and/or to memory controller 236. Memory controller 236 may also be directly coupled to processor 206. Memory controller 236 provides processor system 202 and programmable circuitry 204 access to an external memory (not shown).

I/O devices 238 may be representative of a plurality of different types of I/O devices, e.g., peripherals, that may be included within processor system 202. Exemplary I/O devices represented by I/O devices 238 may include, but are not limited to, one or more of a Serial Peripheral Interface (SPI) bus, an Inter-Integrated Circuit (I²C) bus, a Controller Area Network (CAN) bus, a Universal Asynchronous Receiver/Transmitter (UART), a General Purpose Input/Output (GPIO), a Secure Digital Input Output (SDIO) with direct memory access (DMA), a Universal Serial Bus (USB) with DMA, a gigabit Ethernet (GigE) with DMA, or the like.

I/O devices 238 may be coupled to an I/O multiplexer 244. I/O multiplexer 244 may receive signals from I/O devices 238, and from flash controller 234, and selectively route the signals to I/O pins and/or into programmable circuitry 204. Similarly, I/O multiplexer 244 may selectively route signals from I/O pins into programmable circuitry 204 and/or into one or more of I/O devices 238 and/or flash controller 234.

As noted, programmable circuitry 204 may include a plurality of programmable circuit blocks or tiles. In one example, programmable circuitry 204 may be implemented as a field programmable gate array (FPGA) on a same die as processor system 202. The programmable circuit blocks may include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile may include both programmable interconnect circuitry and programmable logic circuitry. The programmable interconnect circuitry may include a large number of interconnect lines of varying lengths interconnected by programmable interconnect points (PIPs). The programmable logic circuitry implements the logic of a user design using programmable elements that may include, for example, function generators, registers, arithmetic logic, and so forth.

The programmable interconnect and programmable logic circuitries are typically programmed by loading a stream of configuration data into internal configuration memory cells that define how the programmable elements are configured. The configuration data may be referred to as a "configuration bitstream." The configuration data can be read from memory (e.g., from an external PROM) or written into architecture 200 by an external device. The collective states of the individual memory cells then determine the function of the programmable circuitry.

A platform such as platform 135 may be designed for implementation within a target IC using architecture 200. The platform may include software components and hardware components. In one aspect, the platform may provide the infrastructure necessary for a user design to interface with systems external to the IC. For example, the platform may provide the circuitry necessary to communicate with a circuit board such as circuit board 110 as described with reference to FIG. 1 and/or other systems coupled to the circuit board.

The hardware components of the platform may include one or more elements of processor system 202 and/or any circuit blocks that may be implemented using programmable circuitry 204. For purposes of illustration, an exemplary platform is depicted within architecture 200 using dashed lines. The exemplary platform may include one or more software components 248 executing in processor 206. The platform may include one or more hardware components including any components of processor system 202 used by the platform. For example, the platform may include memory controller 236, flash controller 234, and/or one or more I/O devices 238. The hardware components may also include any circuit blocks implemented within programmable circuitry 204. In this example, the circuit blocks may include an input circuit block 252, an output circuit block 254, a data transfer network 256, and a data transfer network 258.

Input circuit block 252 may receive data from external sources, e.g., circuit board 110, and write the data to an external memory coupled to memory controller 236. For example, the external memory may also be coupled to circuit board 110. Input circuit block 252 may provide the data to memory controller 236 through data transfer network 256 and through interconnect 230. Output circuit block 254 may read data from the external memory coupled to memory controller 236. Output circuit block 254, for example, may receive data from the external memory via memory controller 236, interconnect 232, and data transfer network 258. Output circuit block 254 may output data to external destinations such as circuit board 110 or other systems coupled to circuit board 110.

In many cases, it is desirable to take an existing design, such as the platform illustrated in FIG. 2, and modify the design in some way. For example, the functionality of the platform may be extended or modified through the implementation of additional circuit blocks in programmable circuitry 204, the addition of new program code that may be executed by processor 206, by modifying existing circuitry, by modifying existing program code, removing circuitry, removing program code, and/or the like.

Referring to the example of FIG. 2, input circuit block 252 and output circuit block 254 may be configured to receive data and output data, respectively. The platform, as illustrated in FIG. 2, for example, may receive video data, store the video data within an external memory, retrieve the video data from the external memory, and output the video data. In this regard, the platform provides basic input and output features. Actual signal processing, however, in terms of motion detection, color correction, and other user desired image processing functions are lacking from the platform. The platform illustrated in FIG. 2 may be provided in conjunction with circuit board 110, for example, by a vendor and used by an end user as a baseline that may be extended to implement additional user-specified functionality.

For purposes of illustration, circuit blocks 260, data transfer networks 262, and one or more software components 264 may be added to the platform. Blocks 260, 262, and/or 264 may be specified by or derived from HLL application 130. Blocks 260, 262, and 264 are pictured with shading to illustrate that the blocks are not natively part of architecture 200. Further, blocks 260, 262, and 264 are not originally defined within the platform. Instead, blocks 260, 262, and 264 are added to the platform as an enhancement, e.g., by a user, from HLL application 130. The user may or may not have access to the original design files of the platform.

Circuit blocks 252, 254, 256, 258, 260, and 262 may be implemented as a combination of one or more programmable circuit blocks of programmable circuitry 204. In this regard, the term "circuit block" may be used to refer to circuitry implemented within programmable circuitry by way of loading configuration data into the SOC and/or a hardware element of the processor system.

FIG. 2 illustrates that a user may add hardware and/or software to an existing platform. In this example, a host such as host 105 has added circuit blocks 260 to the existing platform. The host further may automatically couple circuit blocks 260 with the platform using an appropriate data mover. A data mover may include a data transfer network, one of data transfer networks 262, and one or more software components 264. It should be appreciated that while the additions to the platform are shown to communicate with processor 206, in other arrangements, added circuit blocks may communicate directly with one or more other circuit blocks implemented within programmable circuitry 204 (e.g., input circuit block 252 and/or output circuit block 254) and/or with one or more elements of processor system 202.

In one arrangement, the hardware and software components of the platform may be encapsulated so that both the hardware and the software may be extended in functionality purely by analyzing the HLL application provided by a user with reference to the platform description. The platform description may describe the operation of the platform and further may specify particular hardware and software resources of architecture 200 that are available as part of the platform for implementing additional features as additional circuit blocks and/or executable program code.

A host may evaluate the platform description, and add, or layer, additional hardware and software onto the existing platform. The system may then compile and link, e.g., generate, the hardware and software components of the extended, or modified, platform into bootable images that may include object code, firmware, and configuration bitstream(s), whether partial or full.

For example, blocks 260 may represent hardware accelerated HLL functions of HLL application 130. Data transfer networks 262 may represent hardware that is automatically generated to couple the hardware accelerated functions with available interfaces of the platform and to processor system 202. Software components 264 may represent portions, which may be modified, of the user's HLL application that may be executed by processor 206.

The exemplary platform of FIG. 2 is provided for purposes of illustration only. The use of a platform directed to video processing is one exemplary use case and is not intended as a limitation of the inventive arrangements described herein. It should be appreciated that a platform may provide and/or implement any of a variety of different operations and/or functions that may be made available to a user. In general, the platform may provide hardware functions that allow a user to further develop functionality of the platform in a software design environment that relieves the user from having to consider hardware interfaces of the target IC or of the circuit board.

Figure 3:
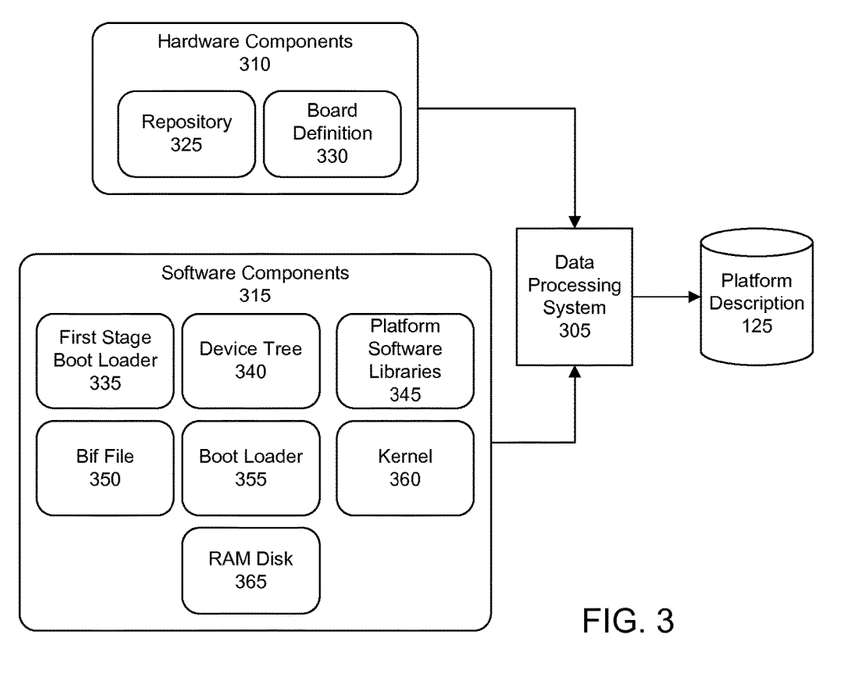
FIG. 3 is a block flow diagram illustrating an exemplary method of creating a platform description.

FIG. 3 is a block flow diagram illustrating an exemplary method of creating platform description 125. Platform description 125 may be provided with platform 135 and corresponding circuit board 110 from a platform provider for use by a user. As pictured, a data processing system (system) 305 may be used to generate platform description 125. As pictured, system 305 may operate on a plurality of hardware components 310 and a plurality of software components 315 of a circuit design that may be used as platform 135. Using hardware components 310 and software components 315, system 305 may generate platform description 125.

The hardware portion of platform 135 may include processor 206 and/or other hardwired circuitry such as memory controller 236 that provides access to external RAM. The hardware portion of platform 135 may also include one or more other circuit blocks implemented within programmable circuitry of target IC 115 that allow processor 206 to interface with digital-to-analog converters (DACs), analog-to-digital converters (ADCs), other types of input/output blocks (e.g., HDMI, DVI, USB, etc.), execution memory (RAM) through memory controller 236, or the like.

In one aspect, hardware components 310 may include a repository 325. Repository 325 may include one or more function blocks that may be implemented in programmable circuitry of target IC 115 and/or in platform 135. One or more or all of the function blocks stored in repository 325 may be added to platform 135. The function blocks may be specified in any of a variety of different formats. For example, function blocks may be specified as hardware modules. The hardware modules may be specified in register transfer level (RTL) format, as logical network lists (netlists), hardware description language (HDL) file(s), hard macros, hardened circuit blocks, configuration bitstreams and/or partial configuration bitstreams, or the like. System 305 may generate metadata describing particular ones of the function blocks of repository 325 that are included in platform 135. The metadata may be stored in platform description 125.

Hardware components 310 may also include a board definition 330. Board definition 330 may specify hardware elements of circuit board 110. As noted, target IC 115 may have an architecture as described with reference to FIG. 2. In general, board definition 330 may be specified as one or more files, e.g., XML files or other markup language files, specifying available peripherals, available ports and/or pins, available settings, presets, and/or the like for circuit board 110.

The software portion of platform 135 may include a boot and a runtime environment. Software components 315 may include any combination of one or more of the following: a first stage boot loader (FSBL) 335, a device tree 340, platform software libraries 345, a Bif file 350, a boot loader 355, a kernel 360, and/or a RAM disk 365. FSBL 335, device tree 340, boot loader 355, kernel 360, and RAM disk 365 may be considered operating system, e.g., Linux, boot files.

FSBL 335, when loaded into target IC 115, may control operations such as loading an operating system from non-volatile memory into processor execution memory, loading a stand-alone image of the operating system from non-volatile memory to a second stage boot loader, loading one or more configuration bitstreams and/or partial configuration bitstreams from non-volatile memory into configuration memory of target IC 115 thereby implementing circuit block(s) in programmable circuitry of target IC 115, or the like. FSBL 335 may include one or more different partitions, where each partition may be an executable code image or a configuration bitstream. Both varieties of partition may be included in a same FSBL.

Device tree 340 may be implemented as a data structure stored in memory that describes hardware of target IC 115. Device tree 340 provides hardcoding details of a device or devices (e.g., circuit blocks) of target IC 115 and/or platform 135 for the operating system that is to be executed by processor 140 (or, for example, processor 206) of target IC 115. Device tree 340 may be provided to the operating system at boot time.

Platform software libraries 345 may include one or more program code libraries. Platform software library 345 may be a collection of implementations of behavior, e.g., operations, drivers, etc., written in a programming language having a well-defined interface by which the behavior is invoked. By including platform library 345, the higher level program using platform library 345 need not be written, or re-written to perform the operations of the library. Rather, the operations of the library may be invoked by the higher level program, e.g., HLL application 130.

Boot image file (Bif) file 350 may include one or more different components depending upon the functionality of the platform. Bif file 350 may include an FSBL. Bif file 350 may also include a universal boot loader and/or a configuration bitstream. Boot loader 355 may be a universal bootloader. Boot loader 355 may be a primary boot loader as is used in embedded devices to package the instructions to boot the operating system kernel of the SOC. Boot loader 355 is typically stored in non-volatile memory and executed to load other data and/or programs from other non-volatile storage into execution memory. Kernel 360 is an image of the operating system to be executed by processor 140 of target IC 115. RAM disk 365 may be a program configured to use a portion of execution memory for processor 140 of target IC 115 (e.g., RAM) as a disk drive.

As noted, system 305, using hardware components 310 and software components 315, may generate platform description 125. Platform description 125 may be implemented as one or more files stored in memory that, when taken collectively, specify metadata for platform 135 describing the various hardware components 310 and software components 315 discussed above for platform 135.

System 305 may generate platform description 125 at the time of export or thereafter. For example, system 305 may generate platform description 125 at compile time of platform 135. System 305 may compile the software environment of platform 135 for processor 140 and perform synthesis, placement, and/or routing on the circuit blocks of repository 325 for platform 135 to generate the completed version of platform 135, e.g., object files and configuration bitstream(s). As part of implementing hardware and software compilation for the platform, system 305 may generate platform description 125 from the original source code files (i.e., HLL source code and/or HDL source code) of the platform.

In some cases, during the design process of platform 135, a designer may flag particular interfaces of platform 135. The interfaces may be flagged using an identifier that, when read by system 305, causes system 305 to include the marked interface in platform description 125. When generating platform description 125, system 305 may include a description of any flagged interfaces within platform description 125. It should be appreciated that since platform 135 is intended to be implemented within a particular SOC, the architecture of that SOC is known by system 305. In this regard, system 305 is aware of which hardware and/or software resources of target IC 115 are used by the platform and which are not.

Figure 4:
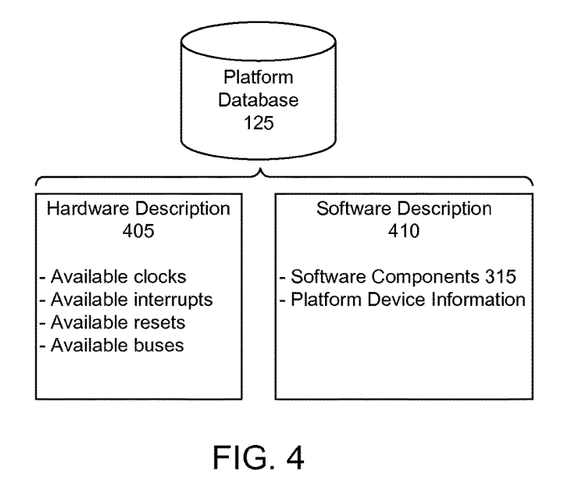
FIG. 4 is a block diagram illustrating an exemplary implementation of a platform description.

FIG. 4 is a block diagram illustrating an exemplary implementation of platform description 125. In the example of FIG. 4, platform description 125 may include a hardware description 405 and a software description 410. In one aspect, each of the descriptions may be specified as an eXtensible Markup Language (XML) file. It should be appreciated, however, that platform description 125 may be specified using any of a variety of different programmatic formats, syntaxes, and/or languages. The particular formats noted herein are provided only for purposes of illustration. Further, platform description 125 may be implemented as a single file or as two or more files.

In general, hardware description 405 may specify available connectivity of the platform. For example, hardware description 405 may specify information about available interfaces of the platform such as available clocks, available interrupts, available resets, and available buses. The aforementioned interfaces may be used to establish communication between processor 140 and one or more circuit blocks not part of the platform, e.g., hardware accelerators, but that will be added and implemented using programmable circuitry of the SOC from HLL application 130. The various resources specified by hardware description 405 may include resources of target IC 115 that are not being used by platform 135 and, as such, are available for use to implement one or more additional circuit blocks for platform 135 to extend functionality.

In further illustration, hardware description 405 may specify any available bus interfaces of the platform and the particular type of port connections that are available on the bus interfaces. For example, for a given bus interface, hardware description file 405 may indicate the available bus and whether the available port of the bus is an S_AXI_ACP, M_AXI_GP1, or the like.

Hardware description 405 further may specify one or more interface properties such as whether the interface is a streaming interface or a memory mapped interface, data width, whether the interface is coherent, is a connection to the processor (e.g., executable program) memory, and the number of available identifier (ID) bits which limit the number of masters for the port. Another property that may be specified is whether an interrupt connection exists for the port and what the interrupt request (IRQ) is for the port.

Hardware description 405 may also specify one or more data flow properties for the interface. As an example, hardware description 405 may specify whether an interface supports packetized data. In addition, hardware description 405 may include one or more enablement parameters. Enablement parameters specify how to enable the interface based upon connectivity that is determined or otherwise inferred by a hardware compiler. When the interface is not used, for example, one or more pins of the interface, when actually implemented within target IC 115, must be properly terminated. In order to use the interface, despite being available as specified in platform description 125, the interface may also need to be enabled. The representation or description of the circuit block of target IC 115 may require configuration to enable the interface that is available. The enable properties indicate how to configure the description of the circuit block to enable the interface for use.

Software description 410 may specify information for the various software components 315 described with reference to FIG. 3. For example, software description 410 may specify file names and/or paths for one or more or all of the various software components described.

In addition, software description 410 may include information specifying a number of devices included in platform 135. Further, software description 410 may specify the number of devices included in platform 135 on a per type basis, where platform 135 includes devices of a plurality of different types. In one example, software description 410 may specify the number of DMA devices included and/or used in platform 135 and/or the number of Linux User 10 (UIO) devices included in platform 135. The number of devices of a given type within platform 135 may be needed by host 105 when tasked with adding hardware and/or software to platform 135 from HLL application 130.

In one arrangement, platform description 125 may specify only interface information needed for generating additional software and/or hardware to operate in cooperation with the platform.

Figure 5:
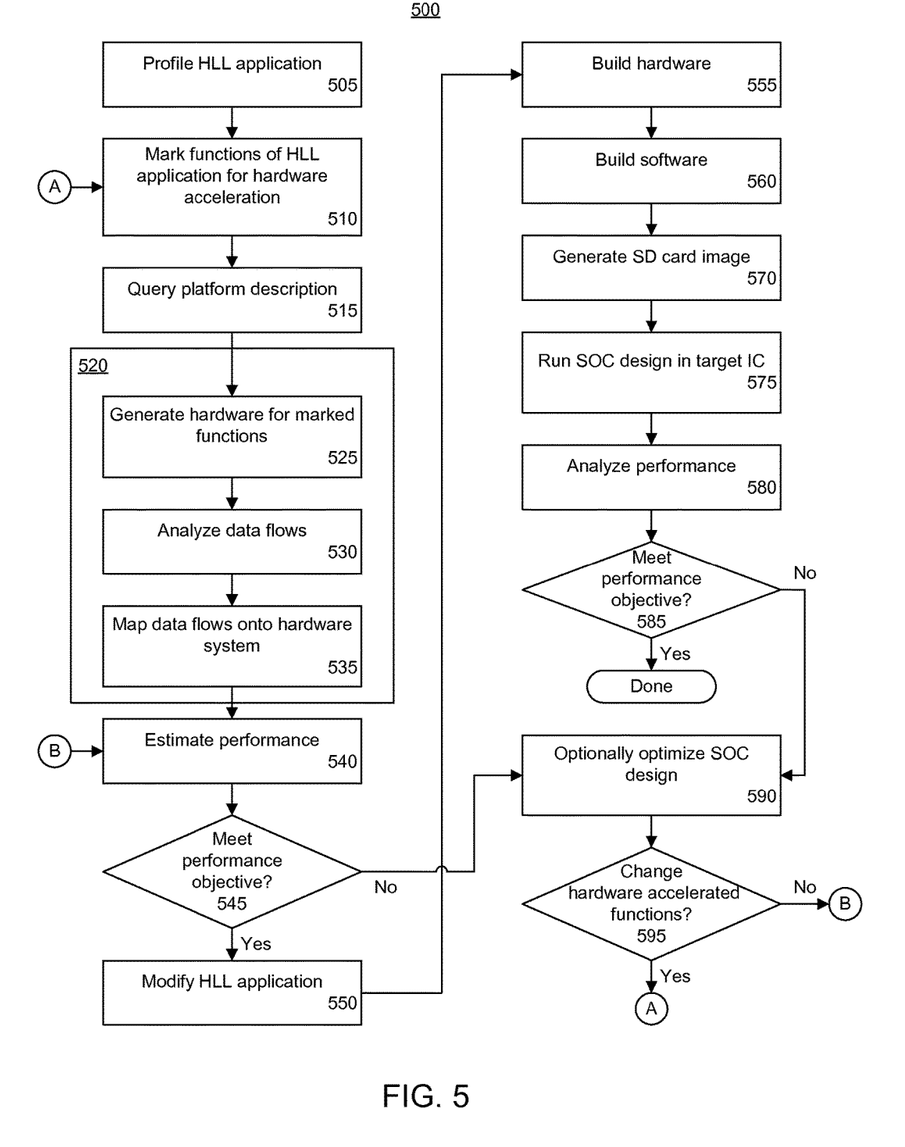
FIG. 5 is a flow chart illustrating an exemplary method of implementing a customized SOC.

FIG. 5 is a flow chart illustrating an exemplary method 500 of implementing a customized SOC. Method 500 may be implemented using the development environment illustrated in FIG. 1. In one arrangement, method 500 may be driven through an application providing an IDE executed by the host. In using the host, the user may provide an HLL application specifying an SOC design as an input and also select a platform to be used in implementing the HLL application within a target IC and/or circuit board combination. As noted, the HLL application may be specified as source code in a high level programming language such as C, C++, or the like. The HLL application further may be properly formatted for compilation into object code for execution on the processor of the target IC.

In block 505, the host may profile the HLL application. The host may determine the functions of the HLL application, determine the input arguments for the functions, determine the output arguments for the functions, determine which functions are source functions that provide data to other functions, determine which functions are load functions that receive data from other functions, determine the amount of data that is passed as inputs to the functions, and/or determine the amount of data that is generated as output by the functions.

In block 510, the host may mark one or more functions of the HLL application for hardware acceleration. In one arrangement, the host may automatically mark one or more functions for hardware acceleration. For example, the host may estimate execution time for the functions automatically. In one illustration, the host may estimate the execution time using lines of code of the functions where each line is assigned an execution time and the line of code execution times are summed for each function. The host may automatically mark one or more functions for hardware acceleration that receive more than a predetermined amount of data as input, generate more than a predetermined amount of data as output, and/or that have an estimated execution time exceeding a predetermined amount of time.

The host may mark the top "N" functions using one or more of the above-described selection criteria, where N may be a user specified integer value or a default system preference. For example, the host may mark the N functions, where N is two, with the longest execution time, the two functions that consume the most data as input, the two functions that generate the most data as output, etc.

In another arrangement, the host may present or display a list of the functions of the HLL application to the user. The list may include one or more candidate functions such as any functions of the HLL application automatically marked by the host for hardware acceleration. The list may include one or more additional functions of the HLL application. The host may present the list and further present, e.g., display, any profiling data for the functions determined in block 505. The host may receive a user selection of one or more of the functions for hardware acceleration. The host may mark each function specified by the received user input.

In block 515, the host may query the platform description to determine available interfaces for the platform. The host, for example, may determine the particular interfaces of the platform that are available for use. The functions of the HLL application to be hardware accelerated may be coupled to one or more of the available interfaces of the platform as determined by querying the platform description. The host further may determine the capabilities of the available interfaces of the platform through querying.

By querying the platform description, the host may determine how to couple additional hardware and/or software elements specified by the HLL application with the platform. In querying the platform description, the host may determine how to couple user specified software and/or hardware with the platform without exposing the actual design files of the platform to the user. The ability to query the platform description allows the actual design files to be protected, e.g., encrypted. As such, a platform provider may make a platform available to users for extension without exposing proprietary aspects of the platform to the users. To the extent that the host may need to access the design files of the platform, the system may do so using encryption, decryption, and/or other security features that allow the host to access and/or use the design files while preventing the user from viewing, opening, or otherwise accessing the design files.

It should be appreciated, however, that the user's HLL application may be used to extend the platform without providing the user with access to the source files of the platform. The platform description includes the information necessary to synthesize designated portions of the HLL application and layer the HLL application onto the existing platform.

In block 520, the host may generate hardware. In block 525, for example, the host may generate hardware for the marked functions of the HLL application. Generating hardware may include generating an RTL description for each function marked for hardware acceleration. In one arrangement, the host may invoke a high-level synthesis (HLS) compiler to transform, or translate, each function selected for hardware acceleration into a functionally equivalent HDL module.

In another aspect, the host may generate hardware by retrieving a hardware module from a repository. The host may include, or have access to, a repository, or library, that includes a plurality of hardware modules. Within the repository, each hardware module may be associated with a functionally equivalent HLL function. The system may search the HLL functions of the repository for the marked function and, responsive to locating a match within the library, retrieve the hardware module associated with HLL function found to match the marked function of the HLL application.

In block 530, the host may analyze data flows of the HLL application. The host may evaluate data flows and, based upon the marked functions, determine whether data is being provided as input to the marked function from another circuit block implemented within the programmable circuitry of the target IC or from the processor system of the target IC (e.g., from software). Similarly, the host may determine whether data is being output from the marked function to another circuit block implemented within the programmable circuitry of the target IC or to the processor system of the target IC.

In one arrangement, the host may create a data transfer graph showing the timing of data flows into and out from each marked function. The data transfer graph may be annotated with the characteristics determined by the host such as the source and/or destination of each data transfer for the marked functions, whether the transfer is between hardware (e.g., with another hardware accelerator or circuit block) or between the hardware and software (e.g., with the processor).

In block 535, the host may map data flows onto hardware systems. In one arrangement, the host may invoke the HLS compiler to map the data transfers, e.g., the data transfer graph for the marked functions, to hardware systems. The host may determine data movers that couple the hardware accelerated functions with the available interface(s) of the platform. The host may generate data movers that are configured to couple the HDL modules, e.g., the hardware accelerated functions, with available interfaces of the platform in accordance with the data flow graph.

For example, the host may generate a data mover for providing data to and/or outputting data from a hardware accelerated function. The data mover may include hardware elements and/or software elements. In terms of hardware elements, the data mover may include a data transfer network that specifies the particular circuitry used to exchange data between the hardware accelerated function and a source and/or load of the hardware accelerated function. For purposes of illustration, the data transfer network may be implemented as a DMA circuit block, a first-in-first-out (FIFO) circuit block, and/or as a direct connection (e.g., interconnect circuitry for communicating with another circuit block) as determined by the host. The data transfer network further may include one or more protocol conversion circuit blocks, hardware accelerator control circuit blocks, and/or the like.

The data transfer network may couple the hardware accelerator to the available interfaces of the platform such as available clocks, interrupts, and the like. For example, the data transfer network may couple a hardware accelerated function to another hardware accelerated function as a direct connection. In another example, the data transfer network may couple hardware accelerated functions to interconnects 230 and/or 232 and/or to I/O multiplexer 244 thereby coupling the hardware accelerated functions to one or more other components of the processor system such as an available one of I/O devices 238, flash controller 234, and/or memory controller 236 which may be accessible via the interconnects and/or I/O multiplexer.

In terms of software elements, the data mover may include program code that facilitates data transfers using the data transfer network. In one aspect, the program code may include a driver and/or control program code as determined from the platform description for a given data transfer network. The control program code may coordinate operation between the processor of the target IC and the driver for the data transfer network. The control program code may be generated for execution in the processor of the target IC to configure the driver for implementing the necessary data transfers to the hardware accelerated functions. In illustration, the control program code may configure the driver to ensure that data of a data transfer arrives at the hardware accelerated function at the correct time from a software point of view. The control program code is aware of the actual content of data that is being sent and/or received.

In one arrangement, the data transfer network may be implemented as a switching network. As such, the control program code may add or insert any tags, symbols, or other identifiers into the data that may be required for steering the data through the data transfer network. In a further aspect, the control program code may include an interrupt handler associated with the particular IRQ that is coupled to the hardware accelerator.

The particular drivers used may be selected according to the data transfer network that is implemented. For example, a driver for a FIFO circuit block or a driver for a DMA circuit block may be selected depending upon the type of data transfer network used. The driver ensures that the resources of the data transfer network operate properly. A driver is unaware of the actual content of the data being sent and/or received. The host may determine the correct driver and/or control program code to use for a given data transfer network by querying the platform description.

In block 540, the host may estimate performance of the HLL application as if the marked functions were hardware accelerated. In one arrangement, a user may invoke a performance estimator from the IDE application in the host. The host may determine a hardware resource estimate for the RTL description of each marked function. Using the estimated hardware resources for the marked functions, the host may calculate a latency for the hardware accelerated functions to perform their enumerated tasks. In one example, the host may generate latency estimates with respect to the clock signal driving the RTL description of the hardware accelerated function(s). Further, the host may include latency and data throughput timing models for both hardware and software components of data movers. With connectivity among hardware accelerated functions determined, the host may determine overall latency for the hardware accelerated SOC design.

In another aspect, in block 540, the host may also estimate performance of portions of the HLL application without hardware acceleration. For example, the host may instrument the HLL application with diagnostic program code that stores the processor program counter value upon calling any hardware accelerated function and upon return from any hardware accelerated function. The diagnostic program code, for example, may determine runtimes for various tasks, functions, or other executable operations occurring in the processor of the target IC. The host may compile and execute the instrumented HLL application on the actual processor of the target IC and obtain performance data for the portion of the HLL application that is not hardware accelerated.

In one exemplary implementation, the host may combine the timing data for the generated hardware for the marked functions with the timing data for the portion of the HLL application that is executed by the processor of the target IC. The host may combine both types of timing data to provide an estimate of performance for the SOC design as a whole if implemented in the target IC with marked functions being implemented as hardware accelerators. For example, the host may replace time calculated as being consumed in the body of hardware accelerated functions with the hardware timing data for the corresponding hardware accelerated functions described above.

It also should be appreciated that a baseline performance of the HLL application may also be determined by instrumenting the entire HLL design without hardware acceleration, compiling the HLL application, and executing the HLL application on the processor of the target IC. The host, for example, may estimate an approximate increase in speed of the HLL application due to hardware accelerating the marked functions over simply executing the HLL application using a processor.

In block 545, a determination may be made as to whether the performance achieved from the HLL application is acceptable. In one aspect, a user may review the estimated performance and provide an input to the host indicating whether the performance is or is not acceptable. In another aspect, the host may compare the timing data for the hardware of the marked functions, the data timing data for the HLL application as executed by the processor of the target IC, and/or the combined timing data with one or more user specified timing requirements for the SOC design. If the performance is acceptable, e.g., meets the timing requirements or user indicates that performance is acceptable, method 500 may continue to block 550. If not, method 500 may proceed to block 590.

In block 550, the host may modify the HLL application to execute in combination with the hardware accelerated functions. Further, the host may modify the HLL application to operate with any software components that may exist for the platform. For example, the host may modify the HLL application to access the hardware accelerators implemented for the marked functions. The host may modify at least a portion of the HLL application with the control program code configured to access the hardware accelerators. In one aspect, the host may modify, or rewrite, the functions marked for hardware acceleration by replacing the body of the function(s) with the control program code including one or more control functions.

In block 555, the host may build the hardware for the SOC design. In one arrangement, building the hardware may include the host synthesizing, placing, and routing the RTL descriptions generated for the marked functions in addition to the data transfer network(s) to couple the hardware accelerators to available interfaces of the platform. In building the hardware, the host builds the hardware to couple to the appropriate interface(s) for each RTL module. The platform may be synthesized, place, and routed.

The host may also generate one or more configuration bitstreams. In one aspect, the host may generate a configuration bitstream, e.g., a single configuration bitstream specifying the combined hardware accelerators, the platform hardware components, and the data transfer networks. The information obtained from querying the platform data may instruct the host how to synthesize, place, and/or route the marked functions and/or the data transfer networks to couple seamlessly to the interface(s) of the platform. In another aspect, the platform may be specified as a configuration bitstream intended to have a dynamic partition. In that case, the portion of the HLL application that is hardware accelerated, e.g., the hardware accelerated functions and the data transfer networks, may be specified as a partial configuration bitstream that may be implemented in the dynamic partition of the configuration bitstream for the platform. This allows a different partial configuration bitstream to be loaded into the target IC that may include different hardware accelerated functions while the platform remains operational.

In block 560, the host may build the software for the SOC design. The host may compile and link the HLL application. The host may link the compiled HLL application with one or more other software components. The system, for example, may compile the modified HLL application into object code and link the compiled HLL application with one or more other compiled components of the user's software. In one aspect, the host may generate an executable that may execute in the processor of the target IC in cooperation with the hardware accelerators.

In another aspect, the system may generate a library file from the compilation and linking. The library file may be linked to a pure software application that is intended for execution on the processor of the target IC. In that case, the library file, when linked to the software application, allows functions of the software application to call hardware functions, e.g., the hardware accelerators, using the library file. As an example, software developers may create a pure software application that may execute on the processor. The library file may be linked with the compiled software application thereby allowing the compiled software application to invoke hardware accelerated functions (i.e., the hardware accelerators implemented in the programmable circuitry) without those developers having to design hardware.

In block 570, the host may generate a secure digital (SD) card image. The SD card image may include the SOC design. The SOC design may include the configuration bitstream(s), executable program code, and any other software components that may be needed to load the configuration bitstream(s) and/or executable program code into the target IC. The configuration bitstream(s) may specify the circuitry to be implemented within the target IC as described. The executable program code may include an executable binary file or a library file that may be loaded and executed by the processor of the target IC. In one arrangement, the configuration bitstream may include, embedded therein, the executable binary file and/or library file that may be executed by the processor of the target IC.

In block 575, the host may run the SOC design in the target IC. The host, for example, may send the SD card image to the circuit board. The SOC design may be stored in flash memory storage. The host may instruct the target IC to load the SD card image thereby implementing the SOC design therein. The configuration bitstream may be loaded into configuration memory of the target IC thereby implementing the hardware portion of the SOC design and load any executable program code into the processor of the target IC for execution therein.

In block 580, the host may analyze performance of the SOC design. For example, the host may determine execution times of functions executing in the processor of the target IC, determine time for hardware accelerated functions to perform operations in circuitry, and the like.

In block 585, the host may determine whether the performance of the SOC design, as implemented within the target IC, is acceptable. The determination of whether performance is acceptable may be made by the host comparing performance data with established design requirements or by a user providing an input indicating whether the performance is acceptable. If the performance is acceptable, method 500 may end. If performance is not acceptable, method 500 may continue to block 590.

In block 590, the host may optionally optimize the SOC design. For example, a user working through the IDE executing in the host may select source code of the HLL application and invoke a graphical user interface for the HLS compiler to further analyze and modify the hardware implementation of the HLL functions. In another example, the user may optionally optimize data transfers and/or parallelism in the SOC design.

The host further allows the SOC design to be instrumented with diagnostic program code. For example, diagnostic program code may be inserted into the HLL application, whether within the HLL functions to be hardware accelerated or other HLL functions. The diagnostic program code may be inserted by the host responsive to a user request.

The instrumented HLL application, when processed by the host for implementation within the target IC, may cause program code executed by the processor of the programmable IC to measure execution times of program code executed therein. The execution time between two or more different points of execution specified by the instrumented code may be measured. Instrumenting the hardware accelerated functions of the HLL application may cause the host to insert probes into the programmable circuitry of the target IC to collect data from the hardware accelerators implemented therein. Instrumenting the HLL application further may cause the processor to measure the time from providing data as input to a hardware accelerator to the time that data is received by the processor as output from the hardware accelerator.

In block 595, a determination may be made whether the particular functions marked for hardware acceleration should be changed. The user may indicate, by way of a user input provided to the host, whether to change the particular functions that are hardware accelerated. Responsive to the user input indicating a desire to change the functions marked for hardware acceleration, method 500 may loop back to block 510. Responsive to a user input indicating that no change in the HLL functions marked for hardware acceleration is desired, method 500 may proceed to block 540.

For purposes of illustration, consider an example where an HLL application includes a matrix multiply function that is marked for hardware acceleration. A matrix multiply hardware module is created that may be implemented in programmable circuitry of the target IC (e.g., as the matrix multiply circuit block). The body of the original matrix multiply function of the HLL application may be processed to include control program code. Example 1 below illustrates exemplary control program code that may be used to replace the body portion of the marked matrix multiply function within the HLL application.

Example 1

```
void mmult_accel ( float in_A[A_NROWS*A_NCOLS],
                  float in_B[A_NCOLs*B_NCOLS],
                  float out_C[A_NROWS*B_NCOLS])
{
    int start_ seq[3];
    start_seq[0] = 0x00000003;
    start_seq [1] = 0x00010001;
    start_seq[2] = 0x00020000;
```

-continued

```
    cf_request_handle_t request_swinst_mmult_accel_cmd;
    cf_send_i (&(swinst_mmult_accel.cmd_mmult_accel),
start_seq, 3*sizeof(int), &request_swinst_mmult_accel_cmd);
    cf_wait(request_swinst_mmult_accel_cmd);
    cf_send_i (&(swinst_mmult_accel.in_A_PORTA), in_A,
1024*4, &request_0);
    cf_send_i (&(swinst_mmult_accel.in_B_PORTA), in_B,
1024*4, &request_1);
    size_t num_out_C_PORTA;
    cf_receive_i(&(swinst_mmult_accel.out_C_PORTA),
out_C, 1024*4, &num_out_C_PORTA, &request_2);
    cf_wait(request_0);
    cf_wait(request_1);
    cf_wait(request_2);
}
```

The above program code communicates with the matrix multiply circuit block when implemented within the programmable circuitry of the target IC. The host may insert one or more declarations and initializations at the beginning of the body. For example, the system may insert several "start_seq" declarations. The system also may insert one or more other functions such as the send (cf_send), receive (cf_receive), and wait (cf_wait) functions.

The function "cf_send_i cf_send_i (&(swinst_mmult_accel.cmd_mmult_accel), start_seq, 3*sizeof(int), &request_swinst_mmult_accel_cmd);" may send a command instructing the matrix multiply circuit block to start. The start sequence is 0, 1, and 2. Next the function "cf_wait(request_swinst_mmult_accel_cmd);" may cause the processor of the target IC to wait to see whether the matrix multiply circuit block has started.

Responsive to determining that the matrix multiply circuit block is started, the functions "cf_send_i (&(swinst_mmult_accel.in_A_PORTA), in_A, 1024*4, &request_0);" and "cf_send_i (&(swinst_mmult_accel.in_B_PORTA), in_B, 1024*4, &request_1);" may send the two matrices as in_A and in_B to the matrix multiply circuit block. The matrix multiply circuit block includes logical ports A and B. In this example, the host has mapped the two matrix inputs of the original matrix multiply function to the arguments in the functions of the control program code that provide the data inputs to the matrix multiply circuit bock.

The "send_i" formative, in Example 1, indicates that responsive to the processor of the target IC setting up the data transfer network to send data, the function returns and does not wait for the matrix multiply circuit block to return a value. The "cf_wait" functions at the bottom of Example 1 wait for the send functions to finish. When requests 0, 1, and 2 are complete, the result from the matrix multiply circuit block has been provided back to the processor and is available for use by the processor.

Figure 6:
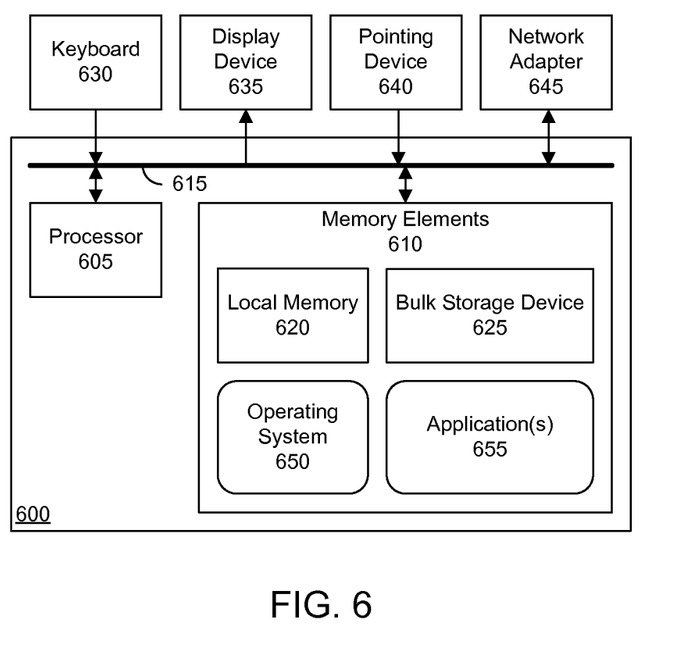
FIG. 6 is a block diagram illustrating an exemplary architecture for a data processing system.

FIG. 6 is a block diagram illustrating an exemplary architecture 600 for a data processing system. Architecture 600 may be used to implement a system such as host 105 and/or data processing system 305 to perform the various operations described herein. Architecture 600 may include at least one processor, e.g., a central processing unit (CPU), 605 coupled to memory elements 610 through a system bus 615 or other suitable circuitry. Architecture 600 stores program code within memory elements 610. Processor 605 executes the program code accessed from memory elements 610 via system bus 615.

Memory elements 610 include one or more physical memory devices such as, for example, a local memory 620 and one or more bulk storage devices 625. Local memory 620 refers to RAM or other non-persistent memory device(s)

generally used during actual execution of the program code. Bulk storage device 625 may be implemented as a hard disk drive (HDD), solid state drive (SSD), or other persistent data storage device. Architecture 600 may also include one or more cache memories (not shown) that provide temporary storage of at least some program code in order to reduce the number of times program code must be retrieved from bulk storage device 625 during execution.

Input/output (I/O) devices such as a keyboard 630, a display device 635, and a pointing device 640 may optionally be coupled to architecture 600. In some cases, one or more of the I/O devices may be combined as in the case where a touchscreen is used as display device 635. In that case, display device 635 may also implement keyboard 630 and pointing device 640.

The I/O devices may be coupled to architecture 600 either directly or through intervening I/O controllers. One or more network adapters 645 may also be coupled to architecture 600 to enable architecture 600 to become coupled to other systems, computer systems, remote printers, and/or remote storage devices through intervening private or public networks. Modems, cable modems, Ethernet cards, and wireless transceivers and/or radios are examples of different types of network adapter 645 that may be used with architecture 600. Depending upon the particular device implemented with architecture 600, the specific type of network adapter, or network adapters as the case may be, will vary.

As pictured in FIG. 6, memory elements 610 may store an operating system 650 and one or more applications 655. Application 655, for example, may be an electronic design automation (EDA) application, an IDE, an HLS, and/or other circuit implementation design tools that may be controlled through the IDE as described herein. In one aspect, operating system 650 and application 655, being implemented in the form of executable program code (e.g., computer readable program instructions), are executed by architecture 600 and, in particular, processor 605. As such, operating system 650 and application 655 may be considered an integrated part of architecture 600. Operating system 650, application 655, and any data items used, generated, and/or operated upon by a system using architecture 600 are functional data structures that impart functionality when utilized by such a system.

In one aspect, architecture 600 may be used to implement a computer or other device that is suitable for storing and/or executing program code. Architecture 600 may be used to implement any of a variety of computer systems and/or devices that include a processor and memory and that are capable of performing the operations described within this disclosure. In some cases, the particular computer system and/or device may include fewer components or more components than described. Exemplary systems may be implemented as a single system having an architecture as shown or as a plurality of networked or interconnected systems each having an architecture the same as, or similar to, that illustrated in FIG. 6.

For purposes of explanation, specific nomenclature is set forth to provide a thorough understanding of the various inventive concepts disclosed herein. The terminology used herein, however, is for the purpose of describing particular aspects of the inventive arrangements only and is not intended to be limiting.

As defined herein, the singular forms "a," "an," and "the" are intended to include the plural forms as well, unless the context clearly indicates otherwise.

As defined herein, the term "another" means at least a second or more.

As defined herein, the terms "at least one," "one or more," and "and/or," are open-ended expressions that are both conjunctive and disjunctive in operation unless explicitly stated otherwise. For example, each of the expressions "at least one of A, B and C," "at least one of A, B, or C," "one or more of A, B, and C," "one or more of A, B, or C," and "A, B, and/or C" means A alone, B alone, C alone, A and B together, A and C together, B and C together, or A, B and C together.

As defined herein, the term "automatically" means without user intervention.

As defined herein, the term "computer readable storage medium" means a storage medium that contains or stores program code for use by or in connection with an instruction execution system, apparatus, or device. As defined herein, a "computer readable storage medium" is not a transitory, propagating signal per se. A computer readable storage medium may be, but is not limited to, an electronic storage device, a magnetic storage device, an optical storage device, an electromagnetic storage device, a semiconductor storage device, or any suitable combination of the foregoing. Memory elements, as described herein, are examples of a computer readable storage medium. A non-exhaustive list of more specific examples of a computer readable storage medium may include: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing.

As defined herein, the term "coupled" means connected, whether directly without any intervening elements or indirectly with one or more intervening elements, unless otherwise indicated. Two elements may be coupled mechanically, electrically, or communicatively linked through a communication channel, pathway, network, or system.

As defined herein, the term "executable operation" is a task performed by a data processing system or a processor within a data processing system unless the context indicates otherwise. Examples of executable operations include, but are not limited to, "processing," "computing," "calculating," "determining," "displaying," "comparing," or the like. In this regard, operations refer to actions and/or processes of the data processing system, e.g., a computer system, or similar electronic computing device, that manipulates and transforms data represented as physical (electronic) quantities within the computer system's registers and/or memories into other data similarly represented as physical quantities within the computer system memories and/or registers or other such information storage, transmission or display devices.

As defined herein, the term "high level programming language" or "HLL" means a programming language, or set of instructions, used to program a data processing system where the instructions have a strong abstraction from the details of the data processing system, e.g., machine language. For example, an HLL may automate or hide aspects of operation of the data processing system such as memory management. The amount of abstraction typically defines how "high level" the programming language is. When using an HLL, the user need not contend with registers, memory addresses, etc. of the data processing system upon which the HLL will execute. In this regard, an HLL includes little or no instructions that translate directly, on a one-to-one basis, into a native opcode of a data processing system. Examples of HLLs include, but are not limited to, C, C++, SystemC, or the like.

As defined herein, the term "hardware description language" or "HDL" is a computer-language that facilitates the documentation, design, and implementation of a digital system. The implementation of the digital system may include the transformation of the digital system into a set of masks for IC manufacturing, the programming of a programmable IC such as a field programmable gate array (FPGA), or the like. Using an HDL, for example, a user can design and specify an electronic circuit, describe the operation of the circuit, and create tests to verify operation of the circuit. An HDL includes standard, text-based expressions of the spatial and temporal structure and behavior of the digital system being modeled. HDL syntax and semantics include explicit notations for expressing concurrent operations in a digital system and synchronizing the progress of concurrent operations to achieve a particular combined behavior. In many circuits, this synchronization is based on a globally visible signal called a "clock." It should be appreciated, however, that other mechanisms for synchronization between portions of a circuit may be provided. Thus, in contrast to most high level programming languages, an HDL includes an explicit notion of time, which is a primary attribute of a digital system. An HDL is not equivalent to a high level programming language.

As defined herein, the terms "includes," "including," "comprises," and/or "comprising," specify the presence of stated features, integers, steps, operations, elements, and/or components, but do not preclude the presence or addition of one or more other features, integers, steps, operations, elements, components, and/or groups thereof.

As defined herein, the term "if" means "when" or "upon" or "in response to" or "responsive to," depending upon the context. Thus, the phrase "if it is determined" or "if [a stated condition or event] is detected" may be construed to mean "upon determining" or "in response to determining" or "upon detecting [the stated condition or event]" or "in response to detecting [the stated condition or event]" or "responsive to detecting [the stated condition or event]" depending on the context.

As defined herein, the term "output" means storing in physical memory elements, e.g., devices, writing to display or other peripheral output device, sending or transmitting to another system, exporting, or the like.

As defined herein, the term "plurality" means two or more than two.

As defined herein, the term "real time" means a level of processing responsiveness that a user or system senses as sufficiently immediate for a particular process or determination to be made, or that enables the processor to keep up with some external process.

As defined herein, the term "responsive to" means responding or reacting readily to an action or event. Thus, if a second action is performed "responsive to" a first action, there is a causal relationship between an occurrence of the first action and an occurrence of the second action. The term "responsive to" indicates the causal relationship.

In some instances, the term "signal" may be used within this disclosure to describe physical structures such as terminals, pins, signal lines, wires. In other instances, the term "signal" may be used to refer to particular values specified by a wire. The term "signal" may refer to the conveyance of a single bit, e.g., a single wire, or the conveyance of multiple parallel bits through multiple parallel wires. Further, each signal may represent bi-directional communication between two, or more, components connected by the signal.

As defined herein, the term "user" means a human being.

The terms first, second, etc. may be used herein to describe various elements. These elements should not be limited by these terms, as these terms are only used to distinguish one element from another unless stated otherwise or the context clearly indicates otherwise.

A computer program product may include a computer readable storage medium (or media) having computer usable readable program instructions thereon for causing a processor to carry out aspects of the present invention. Computer readable program instructions described herein may be downloaded to respective computing/processing devices from a computer readable storage medium or to an external computer or external storage device via a network, for example, the Internet, a LAN, a WAN and/or a wireless network. The network may include copper transmission cables, optical transmission fibers, wireless transmission, routers, firewalls, switches, gateway computers and/or edge devices including edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations for the inventive arrangements described herein may be assembler instructions, instruction-set-architecture (ISA) instructions, machine instructions, machine dependent instructions, microcode, firmware instructions, state-setting data, or either source code or object code written in any combination of one or more programming languages, including an object oriented programming language and/or procedural programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a LAN or a WAN, or the connection may be made to an external computer (for example, through the Internet using an Internet Service Provider).

Certain aspects of the inventive arrangements are described herein with reference to flowchart illustrations and/or block diagrams of methods, apparatus (systems), and computer program products. It will be understood that each block of the flowchart illustrations and/or block diagrams, and combinations of blocks in the flowchart illustrations and/or block diagrams, may be implemented by computer readable program instructions, e.g., program code.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the operations specified in the flowchart and/or block diagram block or blocks.

The computer readable program instructions may also be loaded onto a computer, other programmable data processing apparatus, or other device to cause a series of operations to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various aspects of the inventive arrangements. In this regard, each block in the flowchart or block diagrams may represent a module, segment, or portion of instructions, which comprises one or more executable instructions for implementing the specified operations. In some alternative implementations, the operations noted in the blocks may occur out of the order noted in the figures. For example, two blocks shown in succession may be executed substantially concurrently, or the blocks may sometimes be executed in the reverse order, depending upon the functionality involved. In other examples, blocks may be performed generally in increasing numeric order while in still other examples, one or more blocks may be performed in varying order with the results being stored and utilized in subsequent or other blocks that do not immediately follow. It will also be noted that each block of the block diagrams and/or flowchart illustration, and combinations of blocks in the block diagrams and/or flowchart illustration, may be implemented by special purpose hardware-based systems that perform the specified functions or acts or carry out combinations of special purpose hardware and computer instructions.

The corresponding structures, materials, acts, and equivalents of all means or step plus function elements that may be found in the claims below are intended to include any structure, material, or act for performing the function in combination with other claimed elements as specifically claimed.

A method of implementing an SOC design specified as an HLL application may include querying, using a computer, a platform description to determine an available interface of a platform for a target IC and generating, using the computer, hardware for a function of the HLL application marked for hardware acceleration and hardware coupling the marked function with the available interface of the platform. The method may also include modifying, using the computer, the HLL application with program code configured to access the generated hardware for the marked function and building, using the computer, the hardware and the software of the SOC design.

Generating hardware may include generating an RTL description for the marked function. Generating hardware may include generating a data transfer network that couples the available interface of the platform with the hardware for the function of the HLL application marked for hardware acceleration.

The method may include determining performance of the SOC design. Determining performance may include estimating timing of the generated hardware for the marked function. Determining performance may also include estimating timing for a portion of the HLL application that executes on a processor of the target IC by instrumenting the portion of the HLL application and executing the portion of the HLL application on the processor of the target IC.

Building the hardware and software may include synthesizing, placing, and routing the hardware to couple to the available interface; and, compiling and linking the modified HLL application. Compiling and linking may generate a library file. Accordingly, the method may include linking the library file with an executable.

Modifying the HLL application may include replacing a body of the marked function with control program code for the generated hardware.

A system may include a processor programmed to initiate executable operations. The executable operations may include querying a platform description to determine an available interface of a platform for a target IC and generating hardware for a function of the HLL application marked for hardware acceleration and hardware coupling the marked function with the available interface of the platform. The executable operations may also include modifying the HLL application with program code configured to access the generated hardware for the marked function and building the hardware and the software of the SOC design.

Generating hardware may include generating an RTL description for the marked function. Generating hardware may include generating a data transfer network that couples the available interface of the platform with the hardware for the function of the HLL application marked for hardware acceleration.

The executable operations may include determining performance of the SOC design. Determining performance may include estimating timing of the generated hardware for the marked function. Determining performance may also include estimating timing for a portion of the HLL application that executes on a processor of the target IC by instrumenting the portion of the HLL application and executing the portion of the HLL application on the processor of the target IC.

Building the hardware and software may include synthesizing, placing, and routing the hardware to couple to the available interface; and, compiling and linking the modified HLL application. Compiling and linking may generate a library file. Accordingly, the method may include linking the library file with an executable.

Modifying the HLL application may include replacing a body of the marked function with control program code for the generated hardware.

A non-transitory computer-readable storage medium has instructions stored thereon which, when executed by a processor, perform a method. The method may include querying a platform description to determine an available interface of a platform for a target IC and generating hardware for a function of the HLL application marked for hardware acceleration and hardware coupling the marked function with the available interface of the platform. The method may also include modifying the HLL application with program code configured to access the generated hardware for the marked function and building the hardware and the software of the SOC design.

Generating hardware may include generating an RTL description for the marked function. Generating hardware may include generating a data transfer network that couples the available interface of the platform with the hardware for the function of the HLL application marked for hardware acceleration.

The executable operations may include determining performance of the SOC design. Determining performance may include estimating timing of the generated hardware for the marked function. Determining performance may also include estimating timing for a portion of the HLL application that executes on a processor of the target IC by instrumenting the portion of the HLL application and executing the portion of the HLL application on the processor of the target IC.

Building the hardware and software may include synthesizing, placing, and routing the hardware to couple to the available interface; and, compiling and linking the modified HLL application. Compiling and linking may generate a library file. Accordingly, the method may include linking the library file with an executable.

Modifying the HLL application may include replacing a body of the marked function with control program code for the generated hardware.

The description of the inventive arrangements provided herein is for purposes of illustration and is not intended to be exhaustive or limited to the form and examples disclosed. The terminology used herein was chosen to explain the principles of the inventive arrangements, the practical application or technical improvement over technologies found in the marketplace, and/or to enable others of ordinary skill in the art to understand the embodiments disclosed herein. Modifications and variations may be apparent to those of ordinary skill in the art without departing from the scope and spirit of the described inventive arrangements. Accordingly, reference should be made to the following claims, rather than to the foregoing disclosure, as indicating the scope of such features and implementations.

What is claimed is:

1. A computer-implemented method of implementing a system-on-chip design specified as a high level programming language application, comprising:
    querying, using the computer, a platform description to determine an available interface of a platform for a target integrated circuit, wherein the platform is a circuit design adapted for implementation in the target integrated circuit, and the platform description specifies existing interfaces of the platform not in use;
    generating, using the computer, hardware for a function of the high level programming language application and hardware coupling the function with the available interface of the platform, wherein the generated hardware is for hardware accelerating the function;
    modifying, using the computer, the high level programming language application with program code configured to access the generated hardware for the function; and
    building, using the computer, the hardware and the software of the system-on-chip design.

2. The method of claim 1, wherein:
    design files of the platform are protected from user access; and
    the platform description includes properties of the available interface used to synthesize the function of the high level programming language application and to couple the hardware for the function to the available interface.

3. The method of claim 2, wherein generating hardware comprises:
    generating a data transfer network that couples the available interface of the platform with the hardware for the function of the high level programming language application.

4. The method of claim 1, further comprising determining performance of the system-on-chip design comprising:
    estimating timing of the generated hardware for the function; and
    estimating timing for a portion of the high level programming language application that executes on a processor of the target integrated circuit by instrumenting the portion of the high level programming language application and executing the portion of the high level programming language application on the processor of the target integrated circuit.

5. The method of claim 1, wherein building the hardware and software comprises:
    synthesizing, placing, and routing the hardware to couple to the available interface; and
    compiling and linking the modified high level programming language application.

6. The method of claim 5, wherein compiling and linking generates a library file, the method further comprising:
    linking the library file with an executable.

7. The method of claim 1, wherein modifying the high level programming language application comprises:
    replacing a body of the function with control program code for the generated hardware.

8. A system for implementing a system-on-chip design specified as a high level programming language application, comprising:
    a processor programmed to initiate executable operations comprising:
    querying a platform description to determine an available interface of a platform for a target integrated circuit, wherein the platform is a circuit design adapted for implementation in the target integrated circuit, and the platform description specifies existing interfaces of the platform not in use;
    generating hardware for a function of the high level programming language application and hardware coupling the function with the available interface of the platform, wherein the generated hardware is for hardware accelerating the function;
    modifying the high level programming language application with program code configured to access the generated hardware for the function; and
    building the hardware and the software of the system-on-chip design.

9. The system of claim 8, wherein:
    design files of the platform are protected from user access; and
    the platform description includes properties of the available interface used to synthesize the function of the high level programming language application and couple the hardware for the function to the available interface.

10. The system of claim 9, wherein generating hardware comprises:
    generating a data transfer network that couples the available interface of the platform with the hardware for the function of the high level programming language application.

11. The system of claim 8, wherein the processor is further programmed to initiate executable operations comprising determining performance of the system-on-chip design comprising:
    estimating timing of the generated hardware for the function; and
    estimating timing for a portion of the high level programming language application that executes on a processor of the target integrated circuit by instrumenting the portion of the high level programming language application and executing the portion of the high level programming language application on the processor of the target integrated circuit.

12. The system of claim 8, wherein building the hardware and software comprises:
   synthesizing, placing, and routing the hardware to couple to the available interface; and
   compiling and linking the modified high level programming language application.

13. The system of claim 12, wherein compiling and linking generates a library file, the method further comprising:
   linking the library file with an executable.

14. The system of claim 8, wherein modifying the high level programming language application comprises:
   replacing a body of the function with control program code for the generated hardware.

15. A non-transitory computer-readable storage medium having instructions stored thereon which, when executed by a processor, perform a method of implementing a system-on-chip design specified as a high level programming language application, comprising:
   querying a platform description to determine an available interface of a platform for a target integrated circuit, wherein the platform is a circuit design adapted for implementation in the target integrated circuit, and the platform description specifies existing interfaces of the platform not in use;
   generating hardware for a function of the high level programming language application and hardware coupling the function with the available interface of the platform, wherein the generated hardware is for hardware accelerating the function;
   modifying the high level programming language application with program code configured to access the generated hardware for the function; and
   building the hardware and the software of the system-on-chip design.

16. The non-transitory computer-readable storage medium of claim 15, wherein:
   design files of the platform are protected from user access; and
   the platform description includes properties of the available interface used to synthesize the function of the high level programming language application and couple the hardware for the function to the available interface.

17. The non-transitory computer-readable storage medium of claim 16, wherein generating hardware comprises:
   generating a data transfer network that couples the available interface of the platform with the hardware for the function of the high level programming language application.

18. The non-transitory computer-readable storage medium of claim 15, wherein the method further comprises determining performance of the system-on-chip design comprising:
   estimating timing of the generated hardware for the function; and
   estimating timing for a portion of the high level programming language application that executes on a processor of the target integrated circuit by instrumenting the portion of the high level programming language application and executing the portion of the high level programming language application on the processor of the target integrated circuit.

19. The non-transitory computer-readable storage medium of claim 15 wherein building the hardware and software comprises:
   synthesizing, placing, and routing the hardware to couple to the available interface; and
   compiling and linking the modified high level programming language application.

20. The non-transitory computer-readable storage medium of claim 19, wherein modifying the high level programming language application comprises:
   replacing a body of the function with control program code for the generated hardware.

* * * * *